United States Patent [19]

Lin

[11] Patent Number: 4,940,904

[45] Date of Patent: Jul. 10, 1990

[54] OUTPUT CIRCUIT FOR PRODUCING POSITIVE AND NEGATIVE PULSES AT A SINGLE OUTPUT TERMINAL

[75] Inventor: Cheng F. Lin, Hsing Chu Hsien, Taiwan

[73] Assignee: Industrial Technology Research Institute, Taiwan

[21] Appl. No.: 197,628

[22] Filed: May 23, 1988

[51] Int. Cl.$^5$ .................. H03K 5/00; H03K 5/13; H03K 3/29; H03K 19/00

[52] U.S. Cl. .................... 307/262; 307/269; 307/289; 307/291; 307/473; 307/443

[58] Field of Search ............ 307/473, 262, 269, 443, 307/289, 291

[56] References Cited

U.S. PATENT DOCUMENTS

| | | | |
|---|---|---|---|
| 4,224,534 | 9/1980 | Gordon | 307/473 |
| 4,465,944 | 8/1984 | Shin | 307/473 |
| 4,504,745 | 3/1985 | Spence et al. | 307/269 |
| 4,649,298 | 3/1987 | Tuhy, Jr. | 307/473 |

FOREIGN PATENT DOCUMENTS

| | | | |
|---|---|---|---|
| 0193125 | 11/1982 | Japan | 307/473 |
| 0055720 | 4/1985 | Japan | 307/443 |
| 0057722 | 4/1985 | Japan | 307/443 |

OTHER PUBLICATIONS

Niewiadomski, "Logic Functions from Tri-State Analogue Gates", New Electronics, Jun. 15, 1982, vol. 15, No. 12.

Mouftah, "Ternary Logic in a Positional Control System", Conference 6th-International Symposium on Multi-Valued Logic, Logan, Utah, U.S.A. (25-28, May 1976).

Primary Examiner—Stanley D. Miller
Assistant Examiner—Trong Quang Phan
Attorney, Agent, or Firm—Cahill, Sutton & Thomas

[57] ABSTRACT

An output circuit provides both a positive and negative pulse output at a single output terminal in response to the receipt of a single trigger input pulse for triggering either negative-edge sensitive or positive-edge sensitive input stages of succeeding circuit elements. The circuit includes a latch responsive to the input trigger signal, and the output of the latch is coupled to the data input terminal of a first clocked flip-flop for setting the flip-flop upon receipt of the clock signal. The output of the first clocked fip-flop is coupled to the reset terminal of the latch to reset the output of the first clocked flip-flop to its initial state upon receipt of a second clock signal. The output circuit further includes a divide-by-2 flip-flop clocked by the opposite phase of the clock signal to provide a divided clock signal. A transmission gate selectively enabled by the output of the first flip-flop serves to electrically couple the divided clock signal through the transmission gate to an output terminal thereof for one cycle of the clock following receipt of the trigger pulse. At the end of one complete clock cycle following receipt of the initial trigger pulse, the transmission gate is disabled and assumes a high impedance state. A pull-up resistor or pull-down resistor may be coupled to the output terminal of the transmission gate to generate either a negative-going output pulse or a positive-going output pulse, respectively, to meet the needs of succeeding logic circuitry.

2 Claims, 3 Drawing Sheets

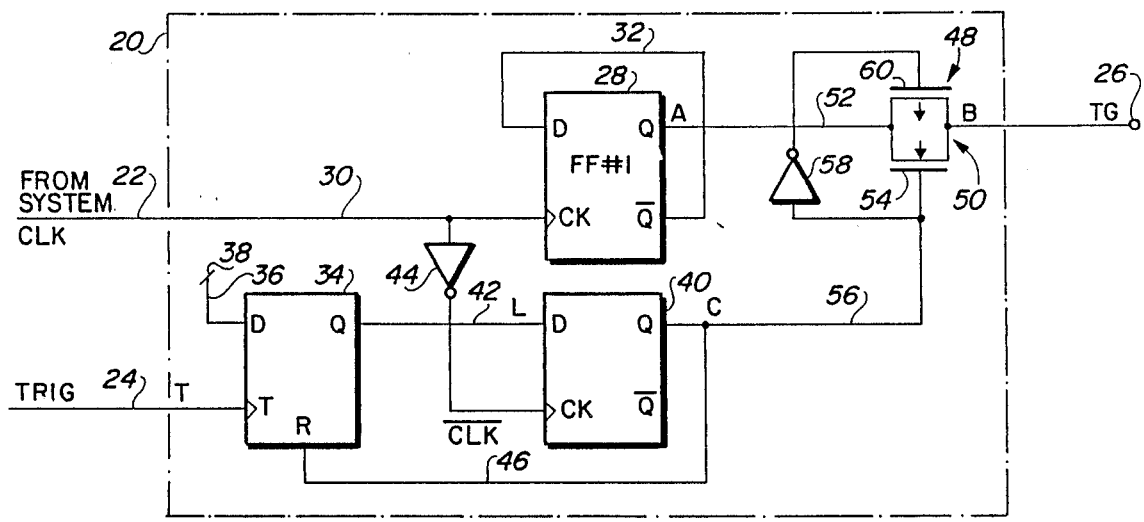
FIG.1
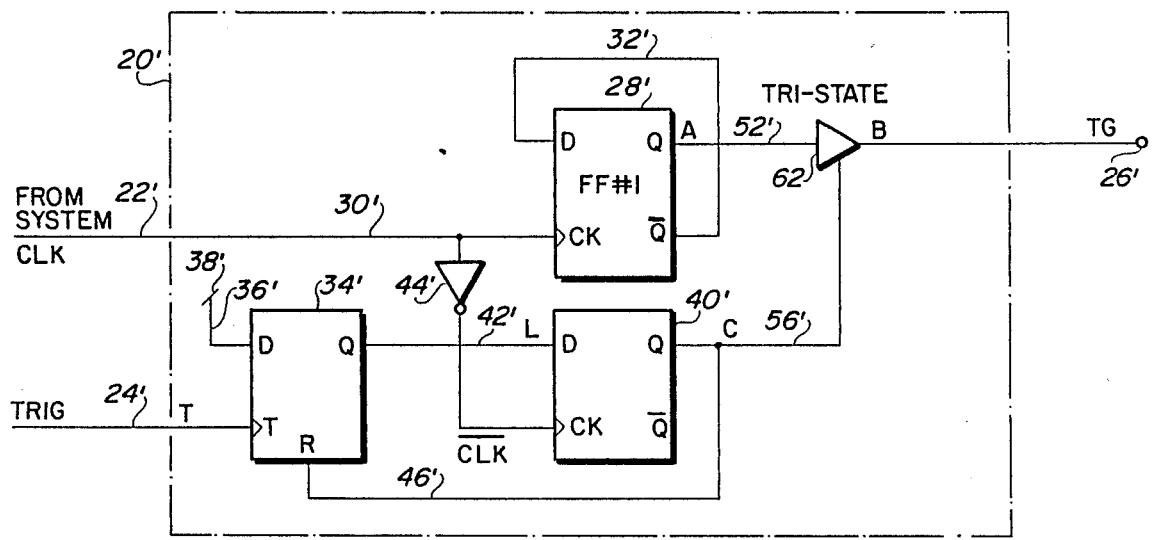
FIG.2
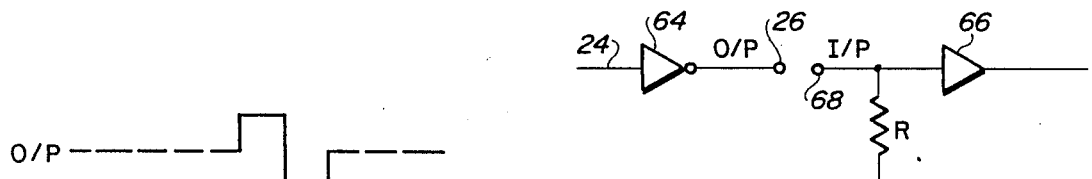
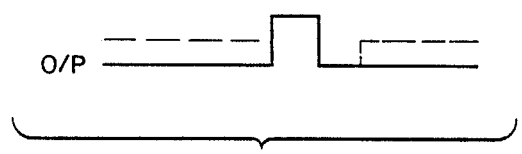
FIG.3
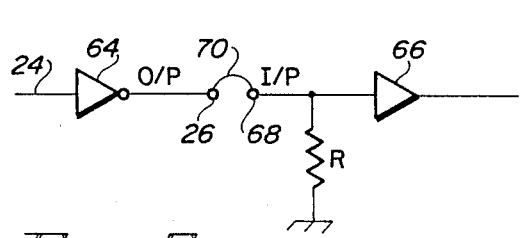
FIG.4
FIG.5

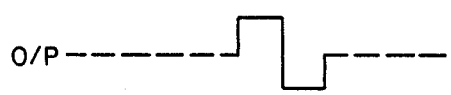
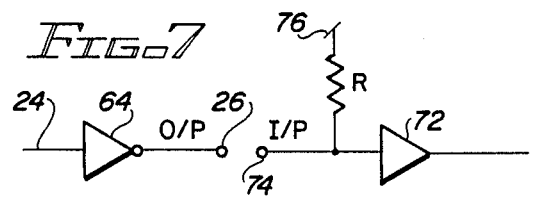
FIG. 7
FIG. 6
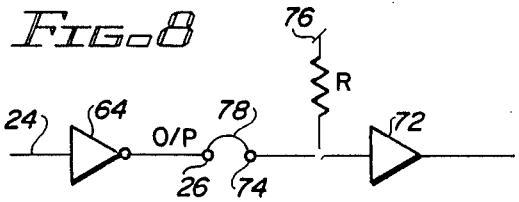
FIG. 8
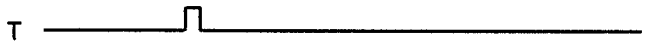
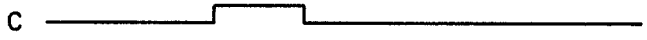
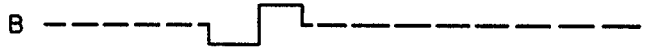
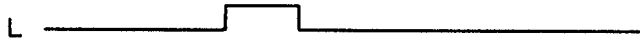
FIG. 9
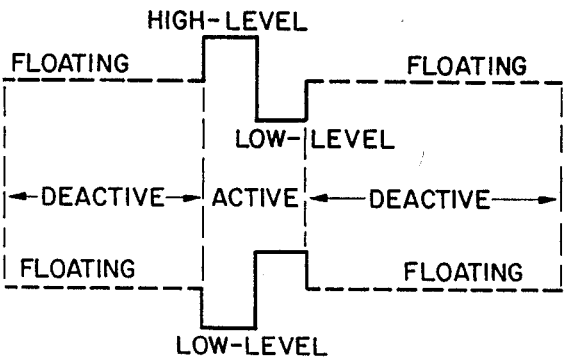
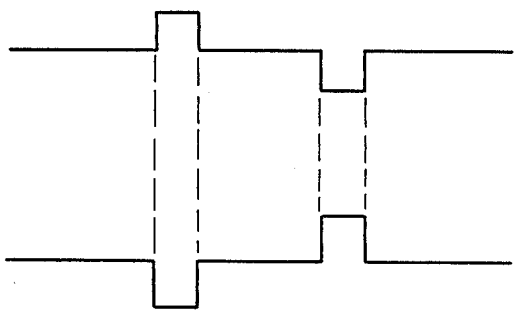
FIG. 11

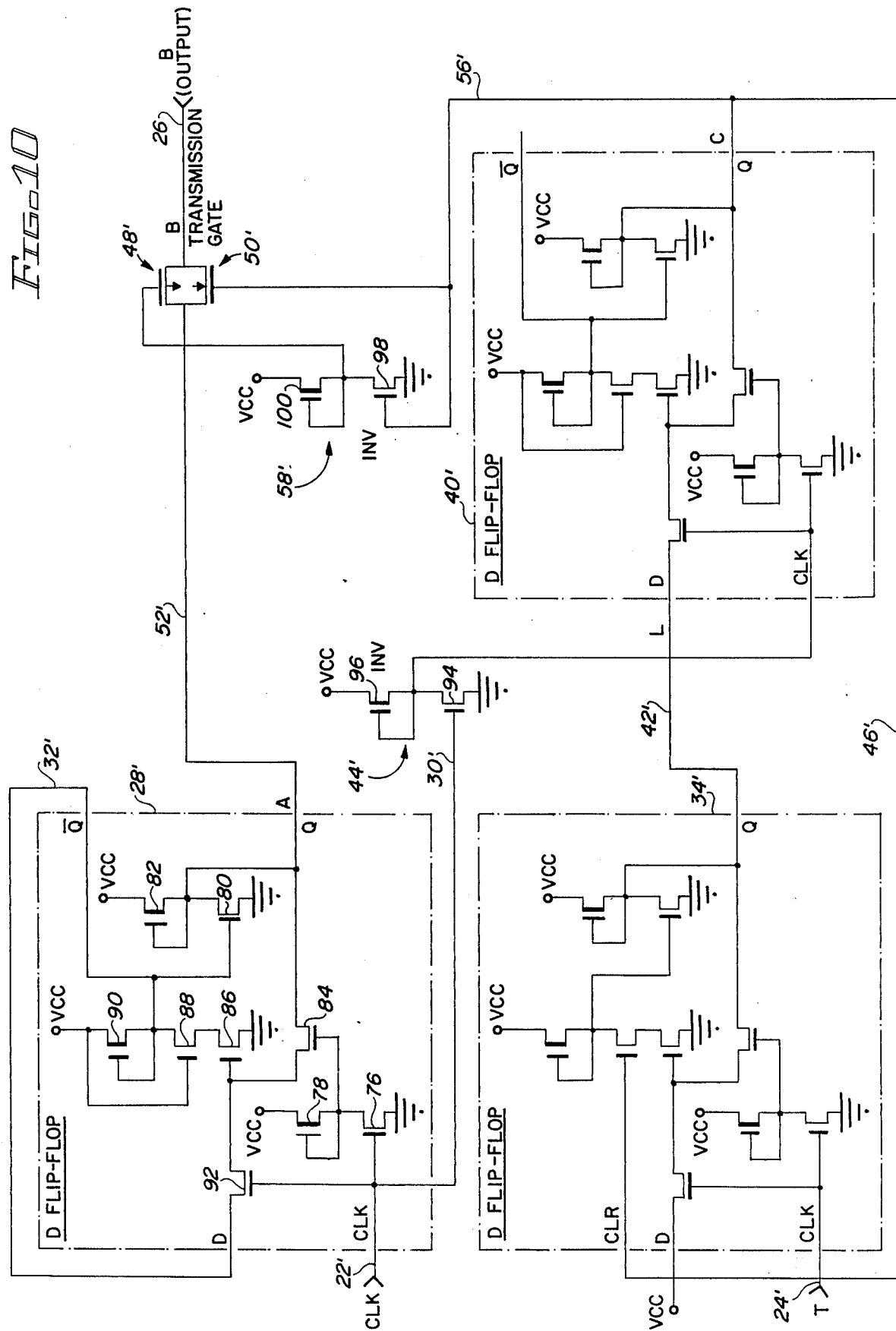

OUTPUT CIRCUIT FOR PRODUCING POSITIVE AND NEGATIVE PULSES AT A SINGLE OUTPUT TERMINAL

BACKGROUND OF THE INVENTION

1. Field of the Invention

The present invention relates generally to electronic digital logic circuits, and more particularly, to an output circuit responsive to a trigger input pulse for providing an output pulse used to drive succeeding logic circuits.

2. Description of the Prior Art

A variety of integrated circuits are presently available which include at least one trigger input terminal pin or clock input terminal pin for causing the integrated circuit to initiate some form of action therein in response to the receipt of a trigger input pulse or clock signal. More particularlY, the trigger input signal or clock signal typically switches betWeen a low logic level (for example, round potential) and a high logic level (for example, a positive power supply voltage), and the integrated circuit is responsive to a particular transition or edge of the trigger input signal or clock signal. When the action taken bY the integrated circuit is initiated upon detection of a transition of the trigger input signal from a low logic level to a high logic level, the circuit is said to be "positive-edge triggered", and a positive-going pulse must be provided to the trigger input terminal of the integrated circuit in order to initiate such action. ConverselY, an integrated circuit which initiates such action upon detecting a transition of the trigger input signal from a high logic level to a low logic level is said to be "negative-edge triggered" and requires the receipt of a negative-going pulse at its trigger input terminal in order to initiate such action. Common integrated circuits which are responsive to trigger input signals or clock signals include latches, flip-flops and monostable multivibrators (or one-shots).

When a circuit designer is creating the design for a new integrated circuit product, the designer must consider the requirements of other integrated circuits which the new integrated circuit may be used to drive. More specifically, if the new integrated circuit being designed provides an output pulse Which might be used as a trigger or clock for an input terminal of a next-succeeding integrated circuit, the circuit designer must consider Whether the output pulse should be generated as a positive-going trigger pulse or a negative-going trigger pulse. However, in many cases, the integrated circuit manufacturer desires that the new integrated circuit Will be useful with a wide variety of other circuits, some of which require a positive going trigger or clock pulse input, and others Which require a negative-going trigger or clock pulse input. In the past, circuit designers have dealt with this problem by providing not one, but two, output pulse terminals, one of which provides a positive-going output trigger pulse, and the second of which provides a negative-going output trigger pulse. In this manner, users of such an integrated circuit may select either of such output terminals for coupling to a next succeeding integrated circuit.

While the provision of two output pulse terminals as described above relieves the integrated circuit designer from deciding whether the output pulse should be positive-going or negative-going, the requirement for two output terminal pins poses an obvious disadvantage. As integrated circuits become more complex, the number of electrical connections which must be made between the integrated circuit and the outside world typically becomes greater. Due to integrated circuit packaging limitations, integrated circuit design is often limited by the number of terminal pins available in a particular integrated circuit package. Accordingly, integrated circuit designers strive to make the most economical use of the terminal pins provided in a particular package; the dedication of two output terminals pins to provide positive-going and negative-going trigger output pulses for the same basic output signal is wasteful and maY limit the number of functions which the integrated circuit can provide.

Yet another disadvantage arises when an integrated circuit is provided with two output terminal pins for providing positive-going and negative-going trigger output pulses of the same basic output signal. Often, users of such integrated circuits inadvertently select the wrong output terminal when attempting to interconnect the integrated circuit to other integrated circuits. When the user selects the wrong output pulse terminal for coupling to the trigger input of a next-succeeding integrated circuit, the user must devote valuable time to detecting and correcting the problem by selecting the proper output pulse terminal for connection to the trigger input terminal of the next-succeeding integrated circuit.

U.S. Pat. No. 3,593,169 (Markow) discloses a tone burst generator which produces a positive pulse output followed by a negative pulse output in response to the receipt of a single trigger input pulse. HoWever, the circuit disclosed in the Markow patent creates a positive pulse starting and ending at zero volts, and a negative pulse starting and ending at zero volts, and the output terminal is held at zero volts in the absence of a trigger input pulse. While such a circuit may be useful for driving alternating current transmission lines, such as telephone lines and the like, such an output circuit would not be practical for driving succeeding stages of digital logic integrated circuits, since the negative-going output pulse lies entirely below the input switching threshold of a next-succeeding digital logic integrated circuit.

Accordingly, it is an object of the present invention to provide an output circuit which may be used with conventional digital logic integrated circuits and which provides a pulsed output signal which may, in turn, be used to drive a trigger input terminal of a next-succeeding integrated circuit, irrespective of whether the next-succeeding integrated circuit requires a positive-going trigger input pulse or a negative-going trigger input pulse.

It is another object of the present invention to provide such an output circuit which requires only a single output terminal which may be directly interconnected with a trigger input terminal of a next-succeeding integrated circuit, irrespective of whether the next-succeeding integrated circuit requires a positive-going trigger input pulse or a negative-going trigger input pulse.

It is still another object of the present invention to provide such an output circuit which avoids the possibility of end-users inadvertently connecting the input terminal of a next-succeeding integrated circuit to the Wrong output pulse terminal of a pair of such output pulse terminals.

It is a further object of the present invention to provide such an output circuit which eliminates the need for a circuit designer to consider the polarity of the input pulse trigger requirements of next-succeeding integrated circuits to be driven by such an output circuit.

It is a still further object of the present invention to provide such an output circuit Which, through the addition of a single external, passive component, can provide either a positive-going output pulse or a negative-going output pulse.

These and other objects of the present invention will become more apparent to those skilled in the art as the description thereof proceeds.

SUMMARY OF THE INVENTION

Briefly described, and in accordance with one embodiment thereof, the present invention relates to an output circuit capable of providing both a positive-going and a negative-going trigger output Pulse at a single output terminal in response to the receipt of a single trigger input pulse. The output circuit includes a clock input terminal for receiving a synchronizing clock signal that periodically switches between first and second clock logic levels. The output circuit also includes a trigger input terminal for receiving a trigger pulse, as well as an output terminal for providing an output signal that is capable of assuming three distinct states. In a first state, the output terminal provides a relatively low impedance source of a first output logic level. In a second of such states, the output terminal provides a relativelY low impedance source of a second logic level opposite to the first output logic level. When in the third state, the output terminal presents a relatively high impedance, or floating state.

The aforementioned output circuit also includes control circuitry coupled to the clock input terminal and trigger input terminal, as well as to the output terminal. The control circuit initially causes the output terminal to assume the third or locating state prior to receipt of a trigger pulse. Upon detecting the receipt of a trigger pulse by the trigger input terminal, the control circuit then awaits the detection of a transition of the synchronizing clock signal from a first clock logic level to a second clock logic level, and upon detecting such transition, causes the output terminal to sWitch from the third or floating state to the first output state for providing a relatively low impedance source of the first output logic level. Upon detecting the next transition of the synchronizing clock signal, the control circuit causes the output terminal to switch from the first state to the second state for providing a relatively low impedance source going the opposing second logic evel. Upon detecting a further transition of the synchronizing clock signal, the control circuit causes the output terminal to return to its third or floating state until detection of a further trigger pulse.

The aforementioned output circuit can be configured to provide a negative-going output trigger pulse by coupling a pull-up impedance between the output terminal and a source of a high logic level for maintaining the output signal provided at the output terminal at a high logic level when the output terminal assumes its third or floating state. Similarly, the output circuit can be configured to provide a positive-going output trigger pulse by providing a pull-down impedance coupled betWeen the output terminal and a source of a low logic level for maintaining the output signal provided at the output terminal at a low logic level When the output terminal assumes the third or floating state.

The output circuit preferably includes a pair of output transistors each having a current conducting terminal coupled in common to the output terminal. The control circuit regulates the conductivity of the pair of output transistors for rendering the pair of transistors simultaneously nonconductive during the third or floating state of the output terminal. When the output terminal assumes its first output state, at least one of the output transistors is rendered conductive for coupling the output terminal to a source of the first output logic level; when the output terminal assumes its second state, at least one of the output transistors is rendered conductive for coupling the output terminal to a source of the second output logic level.

In a preferred embodiment of the present invention, the output circuit includes a divide-by-2 circuit coupled to the clock input terminal for receiving the synchronizing clock signal and having an output providing a divided clock signal of a frequency one-half that of the synchronizing clock signal. The output of such divide-by-2 circuit alternates between high and low logic levels upon each transition of the synchronizing clock signal from the second clock logic level to the first clock logic level.

The output circuit maY include a transmission gate having an input coupled to the output of the divide-by-2 circuit for selectively providing the divided clock signal to the aforementioned output terminal of the output circuit. The transmission ate includes a control terminal responsive to a control signal for electrically coupling the divided clock signal to the output terminal when the control signal is in a first enabled state, While causing the transmission ate to assume a high impedance state When the control signal is in a second disabled state. The aforementioned control circuit is coupled to the control terminal of the transmission ate for providing the control signal thereto. The control circuit initially causes the control signal to assume its second disabled state prior to the receipt of a trigger pulse. Upon detecting an input trigger pulse, the control circuit causes the control signal to switch to its first enabled state after detecting a first transition of the synchronizing clock signal from the first clock logic level to the second clock logic level immediately following receipt of the trigger pulse. The control circuit causes the control signal to again switch to its second disabled state after detecting a second transition of the synchronizing clock signal from the first clock logic level to the second clock logic level following receipt of the trigger pulse. In this manner, the transmission gate alternately couples the output terminal to a source of a high logic level for one-half cYcle of the synchronizing clock signal and also couples the output terminal to a source of a low logic level for one-half cYcle of the synchronizing clock signal each time that the control signal assumes its first enabled state.

In order to generate the aforementioned control signal, the aforementioned control circuit maY include a latch having a trigger input coupled to the trigger input terminal and responsive to the receipt of the trigger pulse for being set to a first state and providing an output in a corresponding first logic state. The latch includes a reset terminal for receiving a reset signal which causes the latch to be reset, therebY switching the output of the latch to a second logic state. The control circuit further includes a flip-flop having a data input terminal coupled to the output of the latch and having a clock terminal responsive to the synchronizing clock signal. The flip-flop includes an output which assumes an output state in accordance with the input presented to the data input terminal upon each transition of the synchronizing clock signal from the first clock logic level to the second clock logic level. The output of the flip-flop is coupled to the reset terminal of the latch for resetting the latch each time that the flip-flop is set. The output of the flip-flop is coupled to the control terminal of the transmission gate for providing the control signal thereto. If the present invention is embodied in the form of a MOSFET integrated circuit, the aforementioned transmission gate may include a P-channel MOSFET and an N-channel MOSFET coupled in parallel between the output of the divide-by-2 circuit and the output terminal of the output circuit. The gate terminals of the P-channel and N-channel MOSFETS are driven by true and complemented forms of the aforementioned control signal, whereby the control signal renders the P-channel and N-channel MOSFETS simultaneously conductive or simultaneously nonconductive.

BRIEF DESCRIPTION OF THE DRAWINGS

FIG. 1 is a block diagram of an output circuit responsive to an input trigger pulse for providing an output signal including both a positive-going and a negative-going pulse output, in accordance With the teachings of the present invention.

FIG. 2 is a block diagram of an output control circuit similar to that shoWn in Fi. 1 and including a tri-state output gate.

FIG. 3 shows a pair of output pulse Waveforms before and after coupling the output terminal of the aforementioned output circuit to a pull-down resistor.

FIGS. 4 and 5 are circuit schematic drawings showing the aforementioned output circuit and a next-succeeding integrated circuit, together With a pull-doWn resistor for producing a positive-going trigger output pulse.

FIG. 6 shows a pair of output pulse waveforms before and after coupling the output terminal of the aforementioned output circuit to a pull-up resistor.

FIGS. 7 and 8 are circuit schematic drawings showing the aforementioned output circuit and a next succeeding integrated circuit, together with a pull-up resistor for producing a negative-going trigger output pulse.

FIG. 9 is a set of timing waveforms illustrating the manner in which the output circuits shown in FIGS. 1 and 2 operate.

FIG. 10 is a MOSFET circuit schematic corresponding to the block diagram shown in FIG. 1.

FIG. 11 shows a pair of timing Waveforms for an output signal of the type which can be produced at the output terminal of the present invention.

DETAILED DESCRIPTION OF THE PREFERRED EMBODIMENT

Referring to FIG. 1, an output circuit constructed according to one embodiment of the present invention is shown within the dashed block designated bY reference numeral 20. Output circuit 20 includes a clock input terminal 22 for receiving a synchronizing clock signal that periodically sWitches between a first clock logic level (e.., a high logic level) and second clock logic level (e.., a low logic level). For purposes of the present description, it Will be presumed that an integrated circuit of the type including output circuit 20 is coupled to a positive voltage power supply conductor and to a tround conductor; the term "high logic level" may be understood to refer to a voltage approximating the positive power supply voltage, and the term "low logic level" may be understood to represent a voltage at or near round potential. While the duty cycle (i.e., the ratio of the period over Which the clock signal is at the high logic level relative to the overall period of the clock signal) of the synchronizing clock signal may be any desired value, the description herein presumes a 50% duty cycle, i.e., the clock signal is at the high logic level 50% of the time and at the low logic level 50% of the time. The synchronizing clock signal received by terminal 22 may be a system clock conducted to various integrated circuits on a circuit board to synchronize the operations performed by each of such integrated circuits.

Output circuit 20 includes a trigger input terminal 24 for receiving a trigger input pulse. For purposes of the present description, it is resumed that the trigger input pulse is a positive trigger pulse. Output circuit 20 further includes an output terminal 26 for providing a trigger output pulse following receipt of a trigger input pulse at trigger input terminal 4. As mentioned above, one of the objects of the present invention is to provide such a trigger output pulse in the form of either a positive-going output pulse or a negative-going output pulse in order to properly trigger the trigger input terminals of next-succeeding integrated circuits.

Still referring to FIG. 1, output circuit 20 includes a divide-by-2 circuit in the form of a flip-flop 28 having a data input terminal D, and a clock terminal CK coupled by conductor 30 to clock input terminal 22 for receiving the synchronizing clock signal. Flip-flop 28 includes a first output Q and a second complementary output $\bar{Q}$. The complementary output $\bar{Q}$ is coupled by conductor 32 to data input terminal D for causing the output state of flip-flop 28 to toggle each time flip-flop 28 is clocked by the transition of the synchronizing clock signal from the second (or low) logic level to the first (or high) logic level. Accordingly, output Q of flip-flop 28 provides a divided clock signal having a frequency of one-ha); that of the synchronizing clock signal received by clock input terminal 22. Thus, flip-flop 28, When interconnected as shoWn in FIG. 1, provides a divide-by-2 circuit.

Output circuit 20 of FIG. 1 also includes a latch 34 having a data input terminal D coupled by conductor 36 to positive power supply 38. Latch 34 further includes a trigger input T coupled to trigger input terminal 24 for receiving the trigger pulse. Latch 34 includes a latch output Q for providing a latched output signal. Upon receiving a positive trigger input pulse at trigger input T, latch 34 latches the state of the data input terminal D, or a high logic level, at output Q. Latch 34 further includes a reset terminal R for receiving a reset signal in the form of a high logic level Upon receipt by reset terminal R of a high logic level, latch 34 is reset, and its output Q is returned to a low logic level.

Also included within output circuit 20 is a further flip-flop 40 having a data input terminal D coupled bY conductor 42 to the Q output of latch 34. Flip-flop 40 includes a clock terminal CK, and an inverter 44 is coupled between conductor 30 and clock terminal CK of flip-flop 40 for supplying the complement of the synchronizing clock signal thereto. Flip-flop 40 includes an output Q Which changes state to match the state applied to data input terminal D on the rising edge of the complemented synchronizing clock signal ($\overline{CLK}$). Conductor 46 is coupled between the output Q of flip-flop 40 and reset terminal R of latch 34 in order to cause latch 34 to be reset each time that flip-flop 40 is set.

As shown in FIG. 1, output terminal 26 is coupled in common to the drain terminals of a P-channel MOSFET 48 and an N-channel MOSFET 50. The source terminals of MOSFETs 48 and 50 are also coupled in common by conductor 52 to the Q output of divide-by-2 flip-flop 28. P-channel MOSFET 48 and N-channel MOSFET 50 form a transmission ate for selectively applying the divided clock signal provided at the Q output of flip-flop 28 to output terminal 26. The ate terminal 54 of MOSFET 50 is coupled by conductor 56 to the output Q of flip-flop 40 for receiving a control signal therefrom used to determine When MOSFET 50 is conductive. Inverter 58 is coupled between conductor 56 and the gate terminal 60 of MOSFET 48 for applying the complement of the aforementioned control signal thereto. Within Fi. 1, the control signal conducted by conductor 56 is designated by the letter C, and When control signal C is at a high logic level, both MOSFETs 48 and 50 are rendered conductive to couple the divided clock signal A to the output terminal 26. On the other hand, When control signal C is at a low logic level, MOSFETs 48 and 50 are simultaneously rendered nonconductive, wherebY a high impedance extends between output terminal 26 and the output Q of flip-flop 28 Thus, control signal C is in a first enabled state when it is at a high logic level, and control signal C is in a second disabled state When it is at a loW logic level.

Within FIG. 1, the divided clock signal provided by flip-flop 28 is designated A, and the output signal provided to output terminal 26 is designated B. Those skilled in the art will appreciate that output signal B is capable of assuming three distinct states. In a first of such states, control signal C is at a high logic level, and the divided clock signal A is at a low logic level; in this first state, output terminal 26 provides a relatively low impedance source to a low logic level. In a second of such states, control signal C is again at a high logic level, but the divided clock signal A is at a high logic level; in this second state, output terminal 26 provides a relatively low impedance source of a high logic level. In the third of such output states, control signal C is at a low logic level, MOSFETs 48 and 50 are nonconductive, and output terminal 26 appears as a high impedance.

Latch 34 and flip-flop 40 collectively form a control circuit for generating control signal C following receipt of each trigger pulse by trigger input terminal 24. The manner in which the trigger pulse generates control signal C, and the manner in which the resulting output signal B is generated at output terminal 6, will now be explained with reference to the timing waveforms shown in FIG. 9. Within FIG. 9, the synchronizing clock signal CLK received at clock input terminal 2 is shown by the timing waveform CLK, while the complemented clock signal provided by inverter 44 is shown by the Waveform $\overline{CLK}$. The trigger pulse received by trigger input terminal 24 is shown by the timing waveform designated T. The Q output of latch 34 is represented bY timing waveform L. The divided clock signal produced by divide-by-2 flip-flop 28 is shown bY timing waveform A; the output signal B produced at output terminal 26 is shown by timing waveform B; and the control signal C generated by flip-flop 40 is designated bY timing waveform C.

Within FIG. 9, timing waveforms T, L, C, and B each appear twice; the first set of such timing waveforms are for the case wherein the trigger pulse T is received while the synchronizing clock signal CLK is at a high logic level, and the second series of such timing waveforms are for the case wherein the trigger pulse T occurs while the CLK signal is at a low logic level. Referring to the first set of timing Waveforms, the rising edge of trigger pulse T serves to trigger latch 34 for allowing the high logic level presented to the data input terminal D thereof to be sampled at the Q output thereof; accordingly, the output signal L produced by latch 34 rises to a high logic level. Upon the next transition of the synchronizing clock signal CLK from a high logic level to a loW logic level, flip-flop 40 is clocked by the complemented $\overline{CLK}$ signal, whereby the output Q of flip-flop 40 changes state from a low logic level to a high logic level to reflect the status of signal L applied to the data input terminal D of flip-flop 40. Accordingly, control signal C is shoWn as switching to a high logic level. Control signal C is fed back to the reset terminal of latch 34 by conductor 46, therebY causing latch 34 to be reset, and causing the latch output signal L to return to a low logic level, as shown in FIG. 9.

When control signal C is at a high logic level, MOSFETs 48 and 50 are rendered conductive for allowing divided clock signal A to be coupled to output terminal 26. As shown in FIG. 9, as control signal C rises to a high logic level, output signal B initially switches from a high-impedance, or floating, state to a low logic level, in accordance with the present state of divided clock signal A. Upon the return of the synchronizing clock signal CLK from a low logic level to a high logic level, flip-flop 28 is clocked, causing divided clock signal A to be complemented from a low logic level to a high logic level. Control signal C nonetheless remains at a high logic level, and accordingly the high logic level provided by divided clock signal A is coupled to the output signal B, which rises to a high logic level. Upon the next transition of the synchronizing clock signal from a high logic level back to a loW logic level, flip-flop 40 is again clocked; hoWever, as the output signal L of latch 34 is noW a low logic level, flip-flop 40 is reset, and control signal C returns to a loW logic level. Accordingly, MOSFETs 48 and 50 are again rendered nonconductive, and output signal B returns to a high-impedance, or floating state. Output signal B remains in the floating state until another trigger pulse received to repeat the above-described sequence.

The lower set of timing waveforms shown in FIG. 9 for signals T, L, C and D are similar to those shown in the first set of timing waveforms, except that trigger pulse T occurs while the synchronizing clock signal CLK is at a low logic level for the second set of timing waveforms. Latch 34 is set upon the initial rising edge of trigger pulse T, as for the case described above. The next transition of the synchronizing clock signal CLK from a low logic level to a high logic level causes the divide-by-2 flip-flop 28 to toggle, but flip-flop 40 remains reset until synchronizing clock signal CLK sWitches from a high logic level to a low logic level. Upon the transition of the CLK signal from a high logic level to a low logic level, flip-flop 40 is set, and control signal C switches to a high logic level, thereby enabling the transmission gate formed bY MOSFETs 48 and 50 to couple the high logic level of divided clock signal A to output terminal 26. Upon the next transition of the synchronizing clock signal from a low logic level to a high logic level, divide-by-2 flip-flop 28 is toggled to a loW logic level, and output signal B accordingly switches to a low logic level. Upon the next succeeding transition of the synchronizing clock signal from a high logic level to a loW logic level, flip-flop 40 is reset, control signal C returns to a low logic level, and output signal B returns to the high impedance, or floating state.

FIG. 11 includes two timing Waveforms of the output signal produced by the output circuit of FIG. 1. Within the timing waveforms of FIG. 11, the output signal is initially in the floating state, at which time the transmission ate is in a deactivated or high impedance state. As shown in the upper timing waveform in FIG. 11, during the active, or enabled state, the output signal is driven first to a high-level for one-half clock cycle and then to a loW-level for one-half clock cycle, after Which the output signal is returned to a deactivated floating state. However, as shoWn in the loWer timing waveform of FIG. 11, during the active or enabled period, the output signal may alternatively be driven to a low level first and to a high level second, depending upon When the input trigger pulse is received relative to the state oi divide-by-2 flip-flop 28.

Shown in FIG. 2 is an output circuit 20' substantially similar to the output circuit shown in FIG. 1. Those elements of output circuit 20' shown in FIG. 2 that are identical to those elements shown in output circuit 20 of FIG. 1 are designated by corresponding primed reference numerals. The only difference between output circuit 20' of FIG. 2 and output circuit 20 of FIG. 1 relates to the form of transmission ate used to selectively couple divided clock signal A to output terminal 26' for generating trigger output pulse signal B. As shoWn in FIG. 2, the aforementioned transmission ate for output circuit 20' of FIG. 2 is in the form of a tri-state output circuit 62 which includes an input terminal coupled to conductor 52' for receiving divided clock signal A. Tri-state output circuit 62 also includes a control input terminal coupled to conductor 56' for receiving control signal C. Tri-state output circuit 62 also includes an output coupled to output terminal 26' for providing output signal B. Tri-state output circuits are well known to those skilled in the art and are often used in conjunction with bidirectional data port terminals within microprocessor integrated circuits for permitting a single terminal to alternately serve as an output or an input. When such terminals are to serve as an input, the output devices in the tri-state gate are rendered nonconductive in order to permit the logic level at the terminal to be determined by external circuitry connected therewith. Tri-state output gate 62 shown in FIG. 2 is disabled whenever control signal C is at a loW logic level for causing output terminal 26' to appear as a high-impedance. On the other hand, When control signal C is at a high logic level, tri-state output circuit 62 provides a loW impedance source of an output signal in accordance with the logic state of the divided clock signal A.

An integrated circuit incorporating an output circuit of the type shown in FIGS. 1 or 2 may easily be interfaced to a next-succeeding integrated circuit requiring a positive-going trigger input pulse Referring to FIG. 4, inverter gate 64 represents an integrated circuit Which incorporates the above-described output circuit. Output terminal 26 provides an output signal, like that shown in FIG. 11, in response to the receipt of a trigger input pulse at trigger input terminal 24. Gate 66 in FIG. 4 represents a next-succeeding integrated circuit having a trigger input terminal 68. It is assumed that next succeeding integrated circuit 66 requires a positive-going pulsed input to initiate desired action within integrated circuit 66. Referring briefly to FIG. 3, the upper timing Waveform shoWn therein illustrates the output pulse signal provided at output terminal 26 before coupling output terminal 26 to input terminal 68 of next-succeeding integrated circuit 66. The dashed line portions of the upper waveform in FIG. 3 represent the floating state, While the solid line portions represent the active state of the output signal, during which the output terminal is initially driven to a high logic level and later to a low logic level.

The output signal shown in the upper Waveform of FIG. 3 may easily be converted to the positive pulse trigger output signal shown in solid lines in the lower waveform of FIG. 3 in the manner demonstrated by FIG. 5. A pull-doWn resistor R (or other impedance) is coupled between input terminal 68 and round potential, and output terminal 26 is connected by a jumper 70 to input terminal 68. Pull-down resistor R causes output terminal 26 to be pulled to approximately round potential whenever the output of integrated circuit 64 is in the floating state. Accordingly, the onlY time that output terminal 26 is at a high logic level is during that portion of the active period of the output signal wherein the output circuit actively drives output terminal 26 to a high logic level. Accordingly, the input waveform received by the trigger input terminal of next-succeeding integrated circuit 66 is shown bY the solid line portion within the lower waveform of FIG. 3. The aforementioned solid line portion of the waveform is a simple positive trigger pulse.

Referring to FIG. 7, it will now be assumed that the integrated circuit 64 containing the output circuit of the present invention is to be interfaced with a next-succeeding integrated circuit 72 which includes a trigger input terminal 74 that requires a negative trigger input pulse to initiate desired action within integrated circuit 72. Before coupling output terminal 26 of integrated circuit 64 to input terminal 74 of integrated circuit 72, the pulsed output signal provided at output terminal 26 appears as shown in the upper waveform of FIG. 6, Wherein the dashed line portion again represents the floating state of output terminal 26. The output pulse shown in the upper waveform of FIG. 6 may easily be converted to a simple negative trigger pulse by coupling pull-up resistor R, as shown in FIGS. 7 and 8, between trigger input terminal 74 and the positive voltage supply 76, and by connecting a jumper 78 between output terminal 26 and trigger input terminal 74. Pull-up resistor R shown in FIG. 8 causes output terminal 26 to be pulled to a high logic level whenever output terminal 26 is in the floating state; consequently, the loWer Waveform in FIG. 6 includes solid lines at a high logic level in place of the dashed line portions shown in the upper Waveform. The only time during which output terminal 26 is at a low logic level is during that portion of the active period of the output signal when output terminal 26 is actively driven low by the output circuit of integrated circuit 64. Consequently, the trigger input terminal 74 of integrated circuit 72 receives a simple negative trigger pulse as shown by the solid lines in the loWer waveform of FIG. 6.

FIG. 10 is a complete transistor circuit schematic of the output circuit 20 shown in FIG. 1. The dashed box 28' within FIG. 10 includes the transistors which collectivelY provide the divide-by-2 flip-flop 28 shown in FIG. 1. Those elements shown within FIG. 10 which correspond to elements shown in FIG. 1 are designated by correspondingly primed reference numerals. Within flip-flop 28', transistors 76 and 78 collectively form an inverter gate, Wherein transistor 76 serves as a switching device and transistor 78 serves as a load impedance. Similarly, transistors 80 and 82 form another inverter, wherein transistor 80 serves as a switching device and transistor 82 serves as a load impedance. The signal produced bY switching transistor 80 is selectively coupled bY transistor 84 to the gate of switching transistor 86. Transistor 86 is connected by coupling transistor 88 to a load transistor 90 for producing the $\overline{Q}$ output of flip-flop 28'. The ate of transistor 86 is alternatelY coupled by transistor 92 to conductor 32' for receiving the $\overline{Q}$ output in order to cause flip-flop 28' to toggle. Switching transistor 80 generates the Q output of flip-flop 28' for providing the divided clock signal A.

As shown in FIG. 10, latch 34' maY be implemented as a D-type flip-flop that is constructed identicallY to flip-flop 28'. Similarly, flip-flop 40' may be constructed in an identical manner for providing control signal C to conductor 56'. Switching transistor 94 and load transistor 96 together form an inverter 44' for supplying the complement of the synchronizing clock signal to the clock input of flip-flop 40'. Similarly, switching transistor 98 and load transistor 100 together form inverter 58' for supplying a complement of the control signal C to the gate terminal of P-channel MOSFET 48'.

Those skilled in the art will now appreciate that an output circuit has been described Which, in response to an input trigger pulse, provides a trigger output pulse capable of driving succeeding integrated circuits irrespective of whether such succeeding integrated circuits require a positive input trigger pulse or a negative input trigger pulse. Thus, such an output circuit may be interfaced to either type of integrated circuit using only a single output terminal. Further, as described above, the output pulse provided by the present invention can easily be converted to a simple positive trigger pulse or a simple negative trigger pulse merely through the addition of a pull-down resistor or a pull-up resistor, respectively. The output circuit of the present invention can be used in a wide variety of integrated circuit designs, especially within such consumer-related products as melody integrated circuits, speech synthesis integrated circuits, speech analysis integrated circuits, key finder integrated circuits, and electronic alarm clock integrated circuits. While the invention has been described with reference to preferred embodiments thereof, the description is for illustrative purposes only and is not to be construed as limiting the scope of the invention. Various modifications and changes maY be made by those skilled in the art without departing from the true spirit and scope of the invention as defined by the appended claims.

I claim:

1. A circuit for providing both a positive-going and a negative-going pulse output at a single output terminal in response to the receipt of a single trigger input pulse, said circuit comprising in combination:
   a. a clock input terminal for receiving a synchronizing clock signal that periodically switches between a first clock logic level and a second clock logic level, said synchronizing clock signal having a predetermined frequency;
   b. a divide-by-2 circuit having an input coupled to said clock input terminal for receiving said synchronizing clock signal and having an output providing a divided clock signal, the divided clock signal having a frequency of one-half that of the synchronizing clock signal, the output of said divide-by-2 circuit alternating between high and low logic levels upon each transition of the synchronizing clock signal from the second clock logic level to the first clock logic level;
   c. a transmission gate having a data input coupled to the output of said divide-by-2 circuit for receiving the divided clock signal, said transmission gate having an output terminal for providing both a positive-going and a negative-going pulse output, said transmission gate including a control terminal for receiving a control signal, said transmission gate being responsive to said control signal for electrically coupling the divided clock signal to the output terminal of said transmission gate when the control signal is in a first enabled state, and being responsive to said control signal for causing the output terminal of said transmission gate to assume a high impedance state when the control signal is in a second disabled state;
   d. a trigger input terminal for receiving a trigger pulse; and
   e. control circuit means coupled to said trigger input terminal and to said clock input terminal for receiving the trigger pulse and the synchronizing clock signal, respectively, said control circuit means being coupled to the control terminal of said transmission gate for providing the control signal thereto, said control circuit means initially causing the control signal to assume the second disabled sate prior to receipt of a trigger pulse, said control circuit means causing the control signal to switch to its first enabled state after detecting a first transition of the synchronizing clock signal from the first clock logic level to the second clock logic level after receipt of the trigger pulse, and said control circuit means causing the control signal to again switch to its second disabled state after detecting a second transition of the synchronizing clock signal from the first clock logic level to the second clock logic level following receipt of the trigger pulse, said control circuit means including:
   (i) latch means having an input coupled to said trigger input terminal for receiving the trigger pulse, having a latch output, and having a reset terminal for receiving a reset signal, said latch means causing the latch output thereof to assume a first logic state upon receipt of the trigger pulse and causing the latch output to assume a second logic state upon receiving the reset signal at the reset terminal thereof; and
   (ii) flip-flop means having a data input terminal, a clock terminal, and a control output terminal, the data input terminal of said flip-flop means being coupled to the latch output, the clock terminal of said flip-flop means being responsive to the synchronizing clock signal for causing the control output terminal of said flip-flop means to assume an output state in accordance with the state of the data input terminal upon each transition of the synchronizing clock signal from the first clock logic level to the second clock logic level, the control output terminal of said flip-flop means being coupled to said reset terminal of said latch means and to the control terminal of said transmission gate for supplying the control signal thereto.

2. A circuit recited by claim 1 wherein said divide-by-2 circuit includes a second flip-flop means having a data input terminal, a clock terminal, an output terminal corresponding to the output of said divide-by-2 circuit, and a complementary output terminal coupled to said data input terminal, the complementary output terminal of said second flip-flop means assuming a logic level opposite to that for the output terminal thereof, said second flip-flop means causing the logic levels of its output and complementary output terminals to alternate each time the synchronizing clock signal switches from the second clock logic level to the first clock logic level.

* * * * *